United States Patent
Gaben et al.

(10) Patent No.: US 11,515,148 B2
(45) Date of Patent: Nov. 29, 2022

(54) METHOD FOR PRODUCING AT LEAST ONE DEVICE IN COMPRESSIVE STRAINED SEMICONDUCTOR

(71) Applicant: COMMISSARIAT A L'ENERGIE ATOMIQUE ET AUX ENERGIES ALTERNATIVES, Paris (FR)

(72) Inventors: Loic Gaben, Grenoble (FR); Cyrille Le Royer, Grenoble (FR); Fabrice Nemouchi, Grenoble (FR); Nicolas Posseme, Grenoble (FR); Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 68 days.

(21) Appl. No.: 16/914,541

(22) Filed: Jun. 29, 2020

(65) Prior Publication Data
US 2021/0005443 A1 Jan. 7, 2021

(30) Foreign Application Priority Data
Jul. 5, 2019 (FR) ..................................... 19 07540

(51) Int. Cl.
*H01L 21/02* (2006.01)
*H01L 21/8238* (2006.01)
*H01L 21/3105* (2006.01)

(52) U.S. Cl.
CPC .... *H01L 21/0223* (2013.01); *H01L 21/31056* (2013.01); *H01L 21/823878* (2013.01)

(58) Field of Classification Search
CPC ......... H01L 21/02532; H01L 21/02236; H01L 21/02381
See application file for complete search history.

(56) References Cited

U.S. PATENT DOCUMENTS

2007/0262392 A1 11/2007 Sudo
2009/0170295 A1 7/2009 Vincent et al.
(Continued)

FOREIGN PATENT DOCUMENTS

FR 2 925 979 A1 7/2009
FR 3 066 318 A1 11/2018

OTHER PUBLICATIONS

Vincent et al., "The Ge condensation technique: A solution for planar SOI/GeOI co-integration for advanced CMOS technologies?", Material Science in Semiconductor Processing, 11, 2008, pp. 205-213.

*Primary Examiner* — John A Bodnar
(74) *Attorney, Agent, or Firm* — Oblon, McClelland, Maier & Neustadt, L.L.P.

(57) ABSTRACT

Method for producing a semiconductor device, including:
producing, on a first region of a surface layer comprising a first semiconductor and disposed on a buried dielectric layer, a layer of a second compressive strained semiconductor along a first direction;
etching a trench through the layer of the second semiconductor forming an edge of a portion of the layer of the second semiconductor oriented perpendicularly to the first direction, and wherein the bottom wall is formed by the surface layer;
thermal oxidation forming in the surface layer a semiconductor compressive strained portion along the first direction and forming in the trench an oxide portion;
producing, through the surface layer and/or the oxide portion, and through the buried dielectric layer, dielectric isolation portions around an assembly formed of the compressive strained semiconductor portion and the oxide portion;

(Continued)

and wherein the first semiconductor is silicon, the second semiconductor is SiGe, and said at least one compressive strained semiconductor portion includes SiGe.

10 Claims, 5 Drawing Sheets

(56) References Cited

U.S. PATENT DOCUMENTS

2018/0331221 A1 11/2018 Berthelon et al.
2019/0363190 A1 11/2019 Berthelon et al.

METHOD FOR PRODUCING AT LEAST ONE DEVICE IN COMPRESSIVE STRAINED SEMICONDUCTOR

TECHNICAL FIELD AND PRIOR ART

The invention relates to the field of microelectronics, and advantageously relates to the production of strained CMOS (Complementary Metal Oxide Semiconductor) transistors with FDSOI (Fully Depleted Silicon-On-Insulator) technology.

A mechanically deformed crystalline material corresponds to a crystalline material which has the lattice parameter(s) thereof elongated or shortened. In the case where the deformed lattice parameter is greater than the so-called "natural" parameter of the crystalline material, the latter is said to be subject to tensile deformation. When the deformed lattice parameter is less than the natural lattice parameter, the material is said to be subject to compressive deformation or under compression.

Mechanical strain states are associated with these mechanical deformation states of a crystalline material. For all that, it is also common to refer to these deformation states as mechanical strain states. In the present application, this concept of deformation is denoted generically using the term "strain".

In order to enhance the performances of a transistor, the latter may be produced with a strained channel, i.e. wherein the semiconductor forming the channel includes a strain, or is subject to a strain.

In a P-type FET transistor (Field-Effect Transistor), a compressive strain, or compression strain, of the channel, oriented parallel with the direction of gate length, i.e. parallel with the direction of current flow in the channel and which is also referred to as the longitudinal direction or orientation, makes it possible to enhance the mobility of charge carriers (holes) in the channel (in the case of a <110> oriented (001) silicon substrate) the most, with respect to other types of strain. In an N-type FET transistor, it is a tensile strain of the channel, oriented parallel with the longitudinal direction, that makes it possible to enhance the mobility of the charge carriers (electrons) in the channel the most.

In order to produce a P-type FET transistor with a compressive strained channel, it is possible to use a substrate comprising an active layer (layer wherein the channel, the source, and the drain of the transistor are produced) of which at least one region includes compressive strained semiconductor, for example SiGe.

Such a substrate is for example produced using a silicon-on-insulator type substrate, herein SOI. The SOI substrate includes a base layer, or thick layer, whereon a buried dielectric, or BOX (Buried Oxide), layer is located, comprising for example $SiO_2$ and wherein the thickness is for example between about 15 nm and 200 nm. A surface layer, or thin layer, wherein the thickness is for example between about 5 nm and 30 nm, is disposed on the BOX and comprises silicon. The active zones (channel, source, and drain) of the FET transistors are intended to be produced in the surface layer.

SiGe is first of all formed epitaxially on the region(s) of the silicon surface layer wherein compressive strained SiGe is intended to be produced and which correspond to the regions wherein P-type FET transistors are intended to be produced. This location of the SiGe on the region(s) of the surface layer sought may be obtained by producing on the surface layer, prior to SiGe epitaxy, a mask wherein the opening(s) define these regions of the surface layer. Due to the difference in lattice parameter between the silicon of the surface layer and SiGe, the SiGe obtained epitaxially on the silicon is compressive strained.

A thermal oxidation step of the SiGe layer is then carried out at a high temperature, for example greater than 850° C., inducing a migration of the germanium atoms present in the SiGe layer toward the silicon of the surface layer. The germanium concentration in the surface layer is homogenized. The buried dielectric layer forms a diffusion barrier during this oxidation. This enrichment with germanium of the silicon of the surface layer modifies the nature of the material of the surface layer which becomes compressive strained SiGe. At the end of this thermal oxidation step, the layer which initially included SiGe then includes mostly $SiO_2$, and the surface layer includes compressive strained SiGe.

The layer of $SiO_2$ formed by the thermal oxidation of SiGe is then removed. The stack of remaining layers form together, at the regions not covered by the mask, an SiGeOI, or SGOI (i.e. SiGe-on-insulator) type substrate, with compressive strained SiGe forming the surface layer of this substrate.

Such a method may also be implemented by forming SiGe epitaxially on the entire silicon surface of the surface layer, i.e. without using a mask. At the end of the method, the entire substrate is of the SGOI type.

This technique for producing compressive strained SiGe, referred to as Ge condensation or Ge enrichment, is for example described in the document "The Ge condensation technique: A solution for planar SOI/GeOI co-integration for advanced CMOS technologies?" by B. Vincent et al., Material Science in Semiconductor Processing 11 (2008), pages 205-213.

Using such a substrate, various technological steps are then carried out. Producing STI (Shallow Trench Isolation) isolation trenches in the substrate, serving to electrically isolate different regions of the substrate from one another, involves etching the surface layer to delimit these regions. An etching mask is for example deposited on the surface layer, then this surface layer is etched according to the mask pattern. This etching is extended through the buried dielectric layer and also into part of the thickness of the base layer. An isolation trench is formed by depositing a dielectric material into the etched trench, then the mask is removed. A substrate comprising different regions isolated from one another by isolation trenches is thus obtained.

A problem encountered with the method described above, for the isolation trenches produced in the compressive strained SiGe, is that, after having produced the isolation trench(es) and after having removed the mask, a reduction of the compressive strain greater than that due solely to the elastic relaxation of the semiconductor, occurs in the parts of the compressive strained SiGe located in the vicinity of the edges (over a distance ranging up to about 200 or 300 nm from the edges). The beneficial effects associated with this strain and obtained in transistors produced in such a substrate are therefore reduced.

The document FR 3 066 318 A1 describes a method for producing N-channel MOS transistors and P-channel MOS transistors. In this method, regions of a silicon active layer undergo germanium condensation, forming regions of compressive strained SiGe intended to produce the P-channel MOS transistors. The regions intended to the production the N-channel MOS transistors are masked during the germanium condensation and thus retained in silicon. A mask of longitudinally and transversally compressive strained (i.e.

subject to compression oriented along two perpendicular directions in relation to one another, one being parallel with the direction of current flow in the transistor channel and the other being perpendicular to the direction of current flow in the transistor channel) silicon nitride is then deposited on the entire active layer. Isolation trenches are then produced via the mask, the active layer as well as the BOX, and a part of the base layer of the substrate. Each of the silicon regions of the active layer intended to the production the N-channel MOS transistors is divided into several subregions by isolation trenches extending longitudinally and transversally. On the other hand, only the isolation trenches extending longitudinally are produced in the SiGe regions of the active layer in order to retain the longitudinal compressive strain in these regions. A thermal oxidation is then carried out locally to form transversal LOCOS (LOCal Oxidation of Silicon) type isolation regions in the SiGe regions.

Although this method makes it possible to better retain the strain in the SiGe regions, it nonetheless has several drawbacks. Indeed, although the transversal isolation trenches are not produced to isolate SiGe regions from one another, transversal isolation trenches are nonetheless produced at the edges of these regions in order to delimit same from those made of silicon. A loss of longitudinal strain is therefore sustained at these edges. Furthermore, producing LOCOS type transversal isolation regions in the SiGe regions involves carrying out specific steps solely dedicated to producing these regions (production of a hard mask, lithography, etching, and removal of the hard mask). Finally, producing LOCOS type transversal isolation regions may create "bird's beak" type deformations in the SiGe, at the edges of these regions.

DESCRIPTION OF THE INVENTION

There is therefore a need to provide a method for producing at least one device in compressive strained semiconductor not having the drawbacks of the methods according to the prior art described above.

For this, one embodiment proposes a method for producing at least one semiconductor device, including the implementation of the following steps:
producing, on at least a first region of a surface layer comprising a first semiconductor and disposed on a buried dielectric layer of a semiconductor-on-insulator type substrate, a layer of a second semiconductor which is compressive strained at least along a first direction;
etching at least one trench through the layer of the second semiconductor forming at least one edge of at least one portion of the layer of the second semiconductor oriented perpendicularly to the first direction, and such that the bottom wall of the trench is formed by the surface layer;
thermal oxidation forming simultaneously in the surface layer at least one semiconductor portion which is compressive strained at least along the first direction, and in the trench at least a first oxide portion;
producing, at least through the surface layer and/or the first oxide portion, and through the buried dielectric layer, dielectric isolation portions at least around an assembly formed of the compressive strained semiconductor portion and the first oxide portion.

In this method, the thermal oxidation for forming the strained semiconductor in the surface layer is carried out after having locally defined, by etching at least one trench, the transversal isolation region(s) to be formed in the compressive strained semiconductor region. This thermal oxidation makes it possible to form both the compressive strained semiconductor in the surface layer and also the first oxide portion(s) intended to electrically isolate this compressive strained semiconductor at the edge(s) in contact with this or these first oxide portions.

Thus, it is possible to create compressive strained semiconductor zones and localized isolation portions of these compressive strained semiconductor zones during the same oxidation step, without an additional lithography step.

Furthermore, this method makes it possible to avoid producing STI type transversal isolation dielectric portions between the compressive strained semiconductor portion and the rest of the surface layer.

This method also makes it possible to avoid carrying out specific steps for producing LOCOS type transversal isolation regions, which reduces the number of steps to be carried out as well as the complexity of these steps.

The first direction may correspond to the longitudinal direction, i.e. the direction intended to be parallel with the length of the gate(s) of the P-type FET transistors to be produced on and in the compressive strained semiconductor portion, or parallel with the direction of current flow in the channel of the P-type FET transistor(s) to be produced on and in the compressive strained semiconductor portion.

The edge oriented perpendicularly to the first direction extends along a perpendicular direction to the first direction.

Advantageously, the first semiconductor may be silicon, the second semiconductor may be SiGe, and the compressive strained semiconductor portion may include SiGe. In this case, the thermal oxidation implemented carries out a germanium condensation in the silicon initially present in the surface layer.

The steps of the method may be implemented such that:
several trenches are etched through the layer of the second semiconductor and form all the edges of several portions of the layer of the second semiconductor which are oriented perpendicularly to the first direction,
the thermal oxidation forms in the surface layer several compressive strained semiconductor portions electrically isolated from one another by several first oxide portions, and
the dielectric isolation portions are produced such that they surround an assembly formed of the compressive strained semiconductor portions and the first oxide portions.

Thus, the compressive strain along the first direction is entirely retained in all the compressive strained semiconductor portions of the assembly.

The steps of the method may be implemented such that:
the dielectric isolation portions also surround at least a second region of the surface layer which is protected by a mask during the implementation of the steps of producing the layer of the second semiconductor, etching the trench(es), and of thermal oxidation, and
at least one of the dielectric isolation portions electrically isolates the second region of the surface layer with respect to the compressive strained semiconductor portion(s).

The semiconductor of the second region of the surface layer is retained and is not altered by implementing thermal oxidation. This second region of the surface layer may particularly serve for producing N-type FET transistors.

The method may further include, between the thermal oxidation and producing the dielectric isolation portions:
depositing an oxide layer covering at least the first oxide portion(s) and at least a second oxide portion formed on the compressive strained semiconductor portion(s) in place of the portion of the layer of the second semiconductor following the implementation of thermal oxidation, and wherein the thickness is greater than that of the compressive strained semiconductor portion(s);

chemical mechanical planarization of the oxide layer;

removing remaining parts of the oxide layer and the second oxide portion(s).

These steps make it possible to remove unnecessary oxide formed during the implementation of the method.

The method may be such that:

the oxide layer also covers the mask protecting the second region of the surface layer;

the chemical mechanical planarization of the oxide layer is stopped on the mask;

removing the remaining parts of the oxide layer and the second oxide portion(s) corresponds to a deoxidation which is controlled and stopped on the compressive strained semiconductor portion(s).

The steps of the method may be implemented such that:

the trenches completely surround, in a plane parallel with the interface between the buried dielectric layer and the surface layer, the or each of the portions of the layer of the second semiconductor;

the or each of the compressive strained semiconductor portions is surrounded completely, in said plane, by the first oxide portions.

By implementing the method such that the compressive strained semiconductor portions are surrounded completely by the first oxide portions, it is possible to retain in the semiconductor portions all the strains present in the material of these portions, regardless of the directions or orientations of these strains. It is for example possible to obtain semiconductor portions which are biaxially compressive strained, i.e. longitudinally and transversally.

The layer of the second compressive strained semiconductor may be produced epitaxially.

The method may further include, after producing the dielectric isolation portions, producing at least one P-type FET transistor on and in the compressive strained semiconductor portion and, when the second region of the surface layer is protected by the mask when implementing the steps of producing the layer of the second semiconductor, etching trenches and thermal oxidation, producing at least one N-type FET transistor on and in the second region of the surface layer.

The steps of the method may be implemented successively.

The method may further include a step of producing a definitive gate implemented after the other steps.

BRIEF DESCRIPTION OF THE DRAWINGS

The present invention will be understood more clearly on reading the description of embodiment examples given merely by way of indication and not limitation with reference to the appended drawings wherein.

Identical, similar, or equivalent parts of the various figures described hereinafter bear the same reference numbers so as to facilitate the transition from one figure to another.

Figure 1:
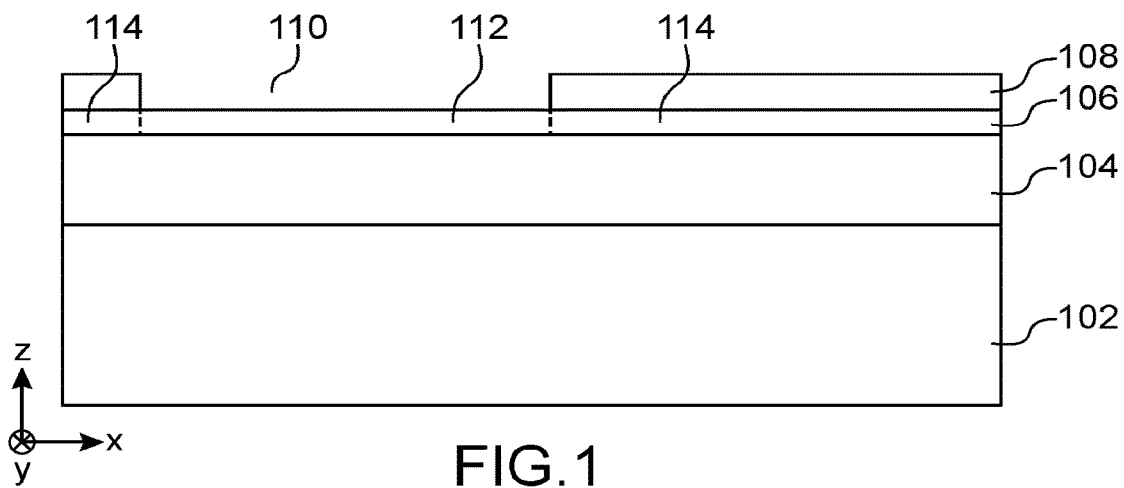
FIGS. 1 to 13 represent the steps of a method for producing semiconductor devices according to a particular embodiment.

The various parts shown in the figures are not necessarily represented on a uniform scale, to render the figures more readable.

The various possibilities (alternative embodiments and embodiments) should be understood as not being mutually exclusive and may be combined with one another.

Detailed Description of Particular Embodiments

The method is implemented using a semiconductor-on-insulator, for example SOI, type substrate, including:

a base layer 102 serving as a mechanical base for implementing the different steps of the method, comprising for example silicon and the thickness whereof is for example equal to several hundred microns;

a buried dielectric, or BOX, layer 104 comprising for example $SiO_2$ and wherein the thickness is for example between about 15 nm and 200 nm; and a surface layer 106 comprising a first semiconductor, for example silicon, and wherein the thickness is for example between about 5 nm and 30 nm.

The surface layer 106 corresponds to the layer whereon and wherein the semiconductor devices are to be produced. In the particular embodiment described herein, these semiconductor devices correspond to FET transistors, and more particularly MOSFET transistors. PMOS transistors are intended to be produced on and in one of more first regions of the surface layer 106, and the NMOS transistors are intended to be produced on and in one or more second regions of the surface layer 106.

As a general rule, the semiconductors may correspond to FET type transistors.

Advantageously, the thickness of the surface layer 106 is suitable for the FET transistors subsequently produced to be of the FDSOI type, and is for example between about 5 nm and 8 nm. The thickness of the surface layer 106 may particularly be selected such that this thickness, which will correspond to the thickness of the channel of the FET transistors, is less than or equal to about one third, or one quarter, of the smallest gate length Lg of the FET transistors. For example, for a gate length Lg=24 nm, the thickness of the surface layer 106 may be selected less than or equal to about 6 nm.

A hard mask 108 is produced on the surface layer 106. For this, the layer(s) intended to form the hard mask 108 are deposited on the surface layer 106. The hard mask 108 includes for example a stack of a layer of semiconductor oxide such as $SiO_2$ and a layer of semiconductor nitride such as SiN. Lithography and etching steps are then implemented so as to form, through the hard mask 108, one or more openings 110 defining the pattern of the hard mask 108.

Figure 2:
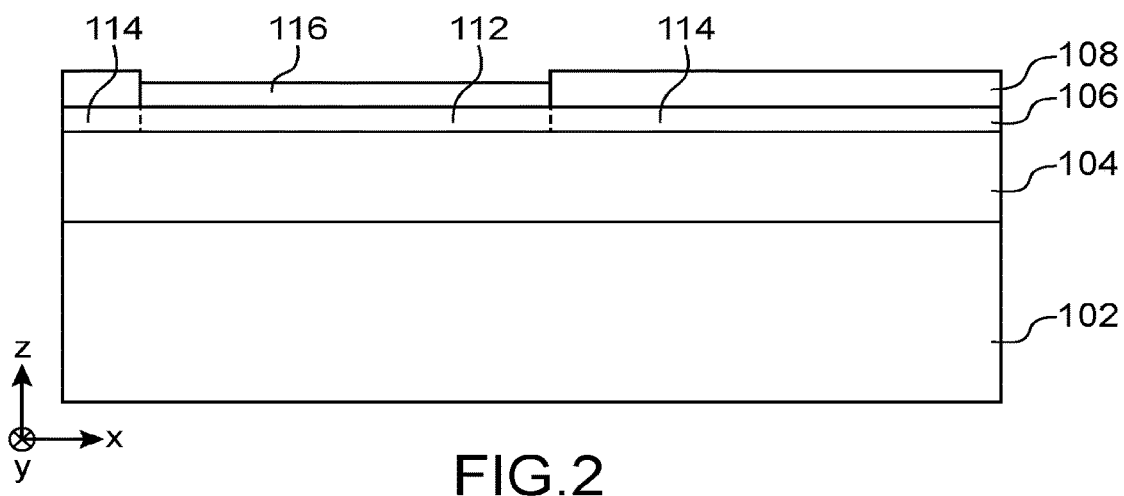
Figure 3:
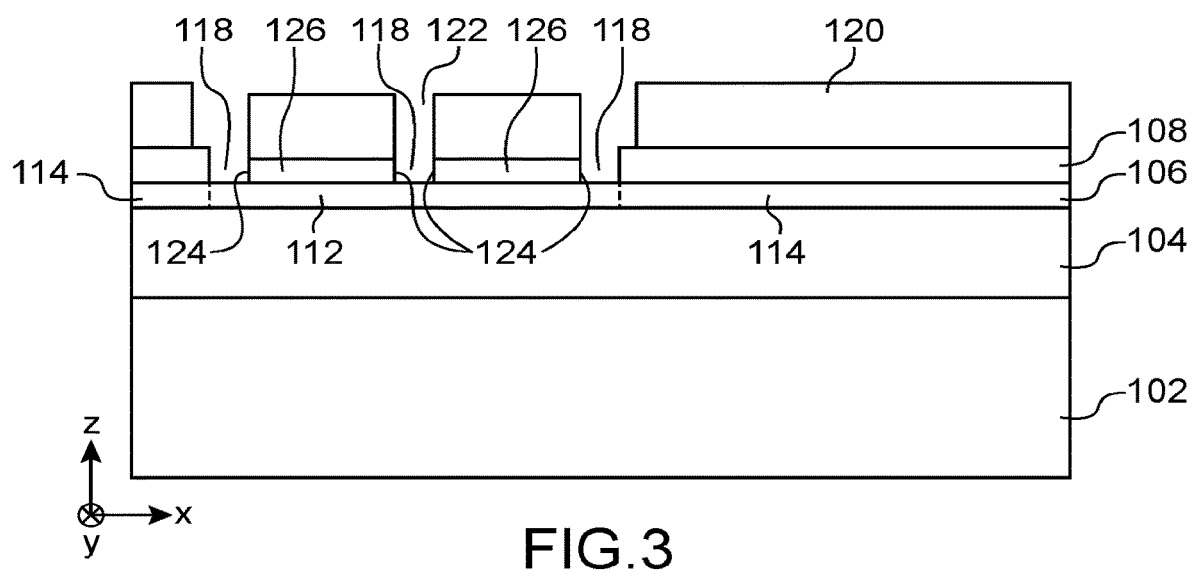

The structure obtained at this stage of the method is shown in FIG. 1. The opening(s) 110 are produced facing one or more first regions 112 of the surface layer 106 intended to produce the PMOS transistors. The portion(s) of the hard mask 108 cover one or more second regions 114 of the surface layer 106 intended to produce the NMOS transistors. In FIGS. 1 to 3, the first regions 112 are separated symbolically from the second regions 114 by dotted lines.

A layer 116 of a second compressive strained semiconductor is produced, for example epitaxially, on the first region(s) 112 of the surface layer 106, i.e. in the opening(s) 110 of the hard mask 108 (see FIG. 2). In the particular embodiment described herein, the second semiconductor corresponds to SiGe. Furthermore, due to the different between the lattice parameter of the silicon of the surface layer 106 and the lattice parameter of the SiGe of the layer 116, the SiGe of the layer 116 obtained epitaxially is compressive strained biaxially, i.e. with a compression strain oriented along two perpendicular directions with respect to one another and located in a plane parallel with the interface between the layer 116 and the surface layer 106 (parallel with the axes X and Y in FIG. 2). A first of these two directions, referred to as longitudinal direction, is intended to be parallel with the gate length, i.e. parallel with the direction of current flow in the channel, of the transistors to be produced at this or these first regions 112. In FIGS. 1 to 13, this first direction is parallel with the axis X. A second of these two directions, referred to as transversal direction, is perpendicular to the longitudinal direction. In FIGS. 1 to 13, this second direction is parallel with the axis Y.

Given that this layer 116 of the second compressive strained semiconductor is intended for the subsequent production of one or more compressive strained semiconductor portions in the surface layer 106 by implementing a thermal oxidation (and more specifically a germanium condensation in the particular embodiment described herein), the thickness of the layer 116 and the composition of the second semiconductor are selected according to the thickness of the surface layer 106, and the thickness and composition sought of the compressive strained semiconductor portion(s). In the particular embodiment described herein, the thickness of the layer 116 and the germanium concentration in the SiGe of the layer 116 are selected according to the thickness of the surface layer 106, as well as the germanium concentration and thickness sought of the compressive strained semiconductor portion(s) to be obtained after implementing thermal oxidation. According to the conservation law of the quantity of germanium atoms, the maximum germanium concentration $X_{Ge,final}$ that can be obtained in the compressive strained semiconductor portion(s) is:

$$X_{Ge,final} = X_{Ge,initial} \times \frac{t_{SiGe,initial}}{t_{SiGe,final}},$$

where $X_{Ge,initial}$ corresponds to the germanium concentration in the SiGe of the layer 116, $t_{SiGe,initial}$ the thickness of the layer 116, and $t_{SiGe,final}$ the sought thickness of the compressive strained semiconductor portions. For example, by producing a layer 116 comprising SiGe having a germanium concentration equal to 27% ($Si_{0.73}Ge_{0.27}$) and of thickness equal to 8 nm, on a surface layer 106 of silicon and of thickness equal to 8 nm, the compressive strained semiconductor portions obtained following the germanium condensation will have a thickness equal to 9 nm with a maximum germanium concentration of 24%. However, given that some of the germanium atoms are oxidized and lost, the final germanium concentration obtained is less than this maximum theoretical value. Considering the example described above, the germanium concentration obtained will be between about 22% and 23%.

As a general rule, the method is implemented such that the semiconductor of the layer 116 is compressive strained along at least a first direction in order to provide, in a p-doped channel of a transistor, a compressive strain which is oriented at least parallel with the longitudinal direction, in order to enhance the mobility of the charge carriers (holes) in the channel.

After producing the layer 116, this layer 116 is etched so as to form edges 124 of one or more distinct remaining portions 126, these edges 124 being parallel with the transversal direction. Trenches 118 etched through the layer 116 form these edges 124 (see FIG. 3).

To form these trenches 118, a resin mask 120 is produced on the layer 116 and on the hard mask 108. The mask 120 includes a pattern formed by openings 122 which pass through the entire thickness of the mask 120 and corresponding to the pattern of the trenches 118 to be produced in the layer 116. An etching of the layer 116, for example a dry RIE (reactive-ion etching) etching, is then implemented according to the pattern defined by the mask 120, with stoppage on the surface layer 106.

These trenches 118 are only etched through the layer 116 and do not pass through the surface layer 106. The bottom walls of the trenches 118 are therefore formed by the surface layer 106.

Figure 4:
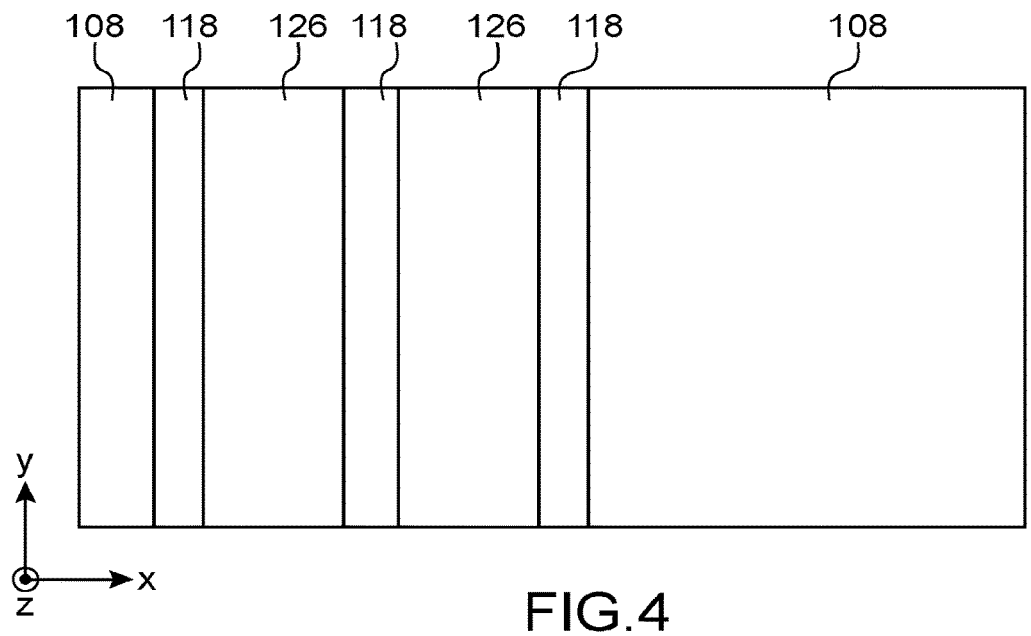

In the example in FIG. 3, this etching of the layer 116 forms two portions 126 separated from one another by one of the trenches 118 and each separated from the hard mask 108 by another of the trenches 118. FIG. 4 shows a partial top view of the structure produced after etching the trenches 118.

The width of each of the trenches 118, symbolized by an arrow in FIG. 3 and which corresponds to the dimension of the trench 118, in the plane parallel with the interface between the layer 116 and the surface layer 106, which is perpendicular with respect to the edge(s) 124 formed by said trench 118, is advantageously the smallest possible, but is limited by the capacity of the lithography equipment used. This width is for example equal to 35 nm.

In the particular configuration visible in FIGS. 3 and 4, three trenches 118 are etched to form two portions 126. According to an alternative embodiment, it is possible to etch a greater number of trenches 118 parallel with one another, in order to form a greater number of portions 126 from the layer 116.

Alternatively, it is also possible for the trenches 118 to be etched only between the portions 126 and not between the portions 126 and the hard mask 108.

According to a further alternative embodiment, it is also possible for a single portion 126 to be formed in the layer 116, with in this case at least one of the two edges 124 of the portion 126 being formed by a trench 118.

After this etching, the mask 120 is removed.

Figure 5:
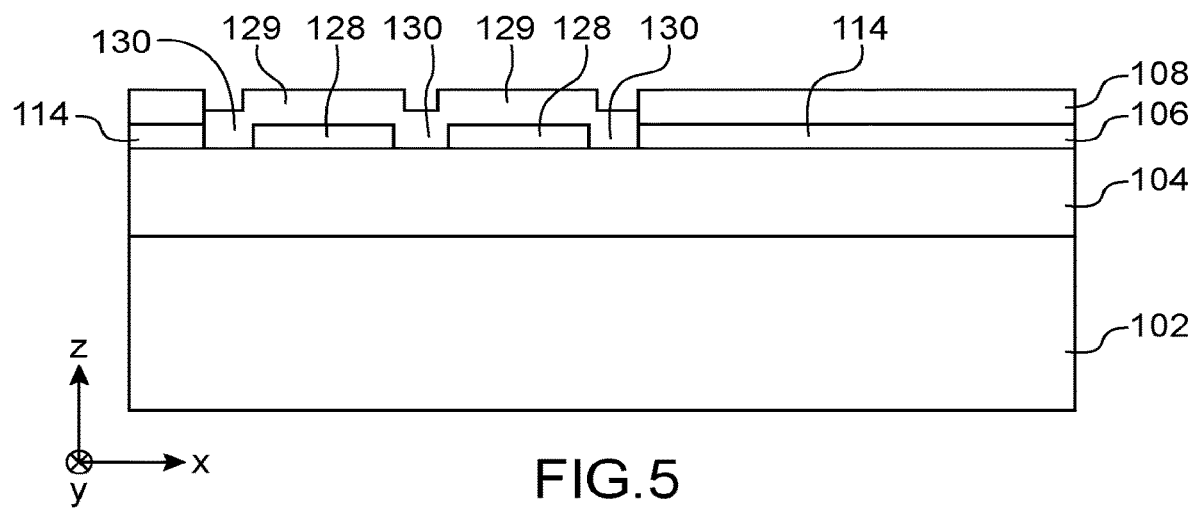

A thermal oxidation is then implemented (see FIG. 5).

This thermal oxidation makes it possible to carry out a condensation of the germanium present in the SiGe of the portions 126. The germanium atoms present in the portions 126 migrate into the parts of the first region(s) 112 of the surface layer 106 covered by the portions 126 and which become compressive strained semiconductor, herein SiGe, portions 128. In the particular embodiment described herein, the portions 128 include a compressive strain oriented parallel with the longitudinal direction and a compressive strain oriented parallel with the transversal direction. These portions 128 are herein intended for the production of PMOS transistor channels. At the end of this thermal oxidation, the portions 126 have been converted into portions 129 including the oxide of the semiconductor initially present in the portions 126.

Simultaneously with the formation of the portions 128, this thermal oxidation also makes it possible to form in the trenches 118 oxide portions 130 carrying out localized isolation of the portions 128 therebetween as well as with respect to the remainder of the surface layer 106 corresponding particularly to the second regions 114.

The thermal oxidation is for example implemented at a temperature of between 1100° C. and 1200° C., and for a duration of between 1 and 10 seconds. The temperature and duration of implementation of this thermal oxidation are selected according to the features sought for the portions 128, particularly the thickness of these portions 128, and also the thickness of the oxide portions 130 to be produced. The temperature and duration of implementation of this thermal oxidation must be sufficient for the material of the parts of the surface layer 106 covered by the portions 126 to be converted over the entire thickness of the surface layer 106, and for oxide portions 130 to each have a thickness at least equal to that of the portions 128.

Due to the thermal oxidation implemented, the dimensions of the portions 128 formed may be less than those of the portions 126 due to the oxide formed at the edges of the portions 128. For example, considering two portions 126 spaced from one another by a distance equal to 35 nm, the portions 128 obtained following the thermal oxidation may be spaced from one another by a distance equal to 55 nm.

Figure 6:
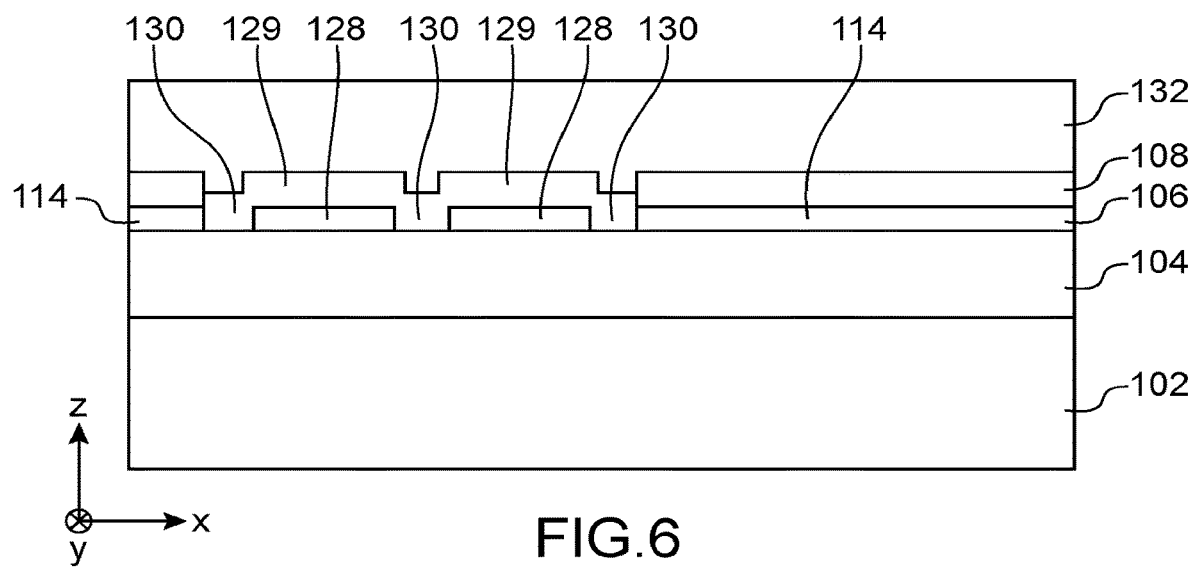

An oxide layer 132 is then deposited onto the structure previously produced, thus covering the oxide portions 129 and 130 as well as the hard mask 108 (see FIG. 6).

Figure 7:
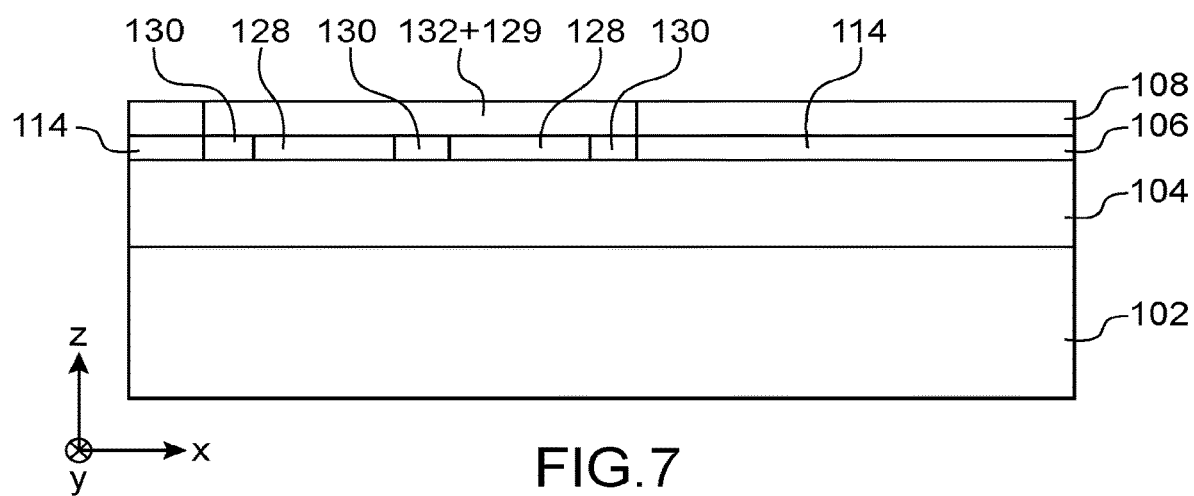

A chemical mechanical planarization of the oxide layer 132 is then carried out, with stoppage on the hard mask 108 (see FIG. 7). The remaining parts of the oxide layer 132 and the portions 129 form, on the side of the layer 132 which is planarized, a substantially planar face aligned with the top face of the hard mask 108.

Figure 8:
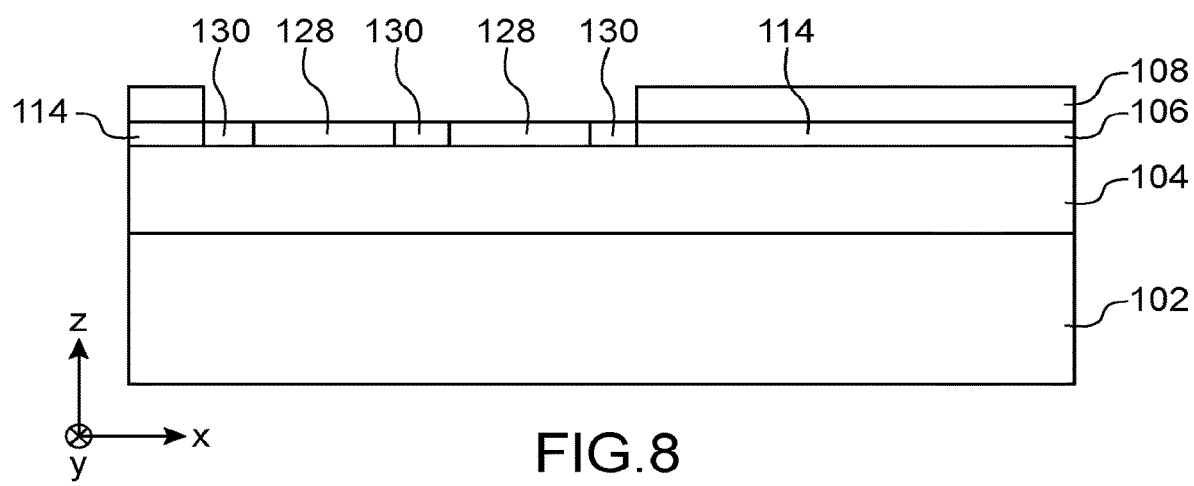

The remaining parts of the oxide layer 132 and the portions 129 are then removed, for example by implementing a deoxidation controlled and stopped on the portions 128 (see FIG. 8). This deoxidation may be obtained with a wet process such as HF diluted for example to 1%.

At this stage of the method, the portions 128 obtained are electrically isolated from one another as well as with respect to the second regions 114 of the surface layer 106. The strain present in the material of the portions 128 has not been altered by producing the oxide portions 130, particularly at the edges of these portions 128.

Figure 9:
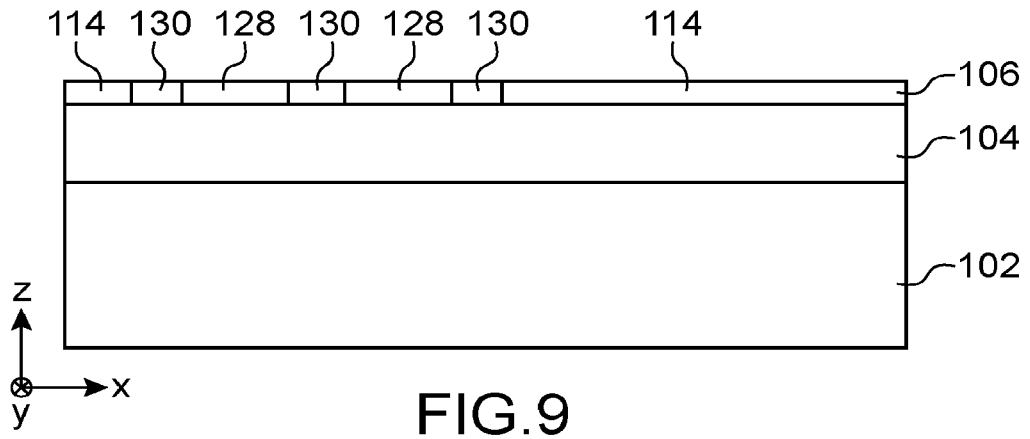

The hard mask 108 is then removed (see FIG. 9).

Figure 10:
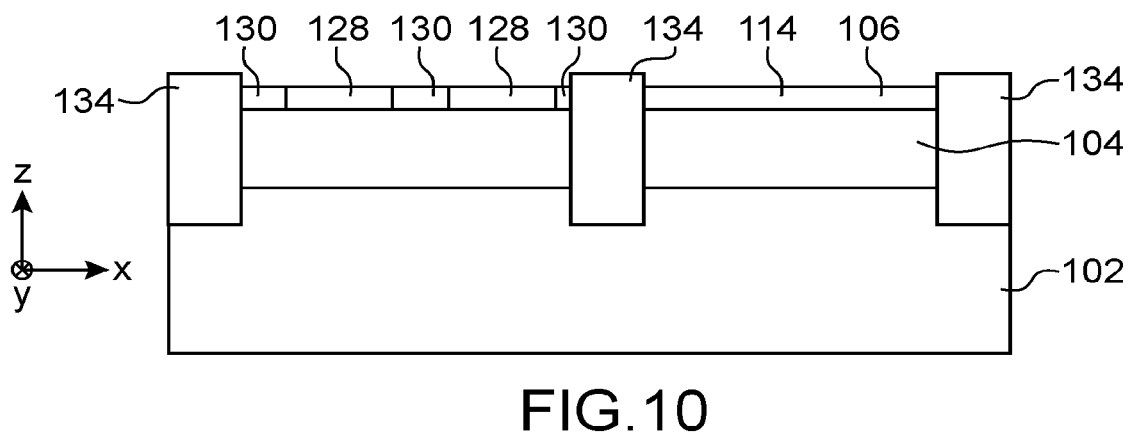

Dielectric isolation portions 134, for example of STI type, are then produced through the surface layer 106, the buried dielectric layer 104 and a part of the thickness of the base layer 102 (see FIG. 10). These dielectric isolation portions 134 are produced around one or more assemblies formed of the portions 128 and 130 intended to serve to produce the PMOS transistors, and herein also around the second region(s) 114 intended to serve to produce the NMOS transistors. These dielectric isolation portions 134 may also serve to divide the or each of the second regions 114 into several parts. Given that the dielectric isolation portions 134 are not produced directly against the edges of the portions 128, the compressive strain present in the semiconductor of the portions 128 is maintained thanks to the oxide portions 130 which have been produced without impacting this compressive strain.

The dielectric isolation portions 134 are for example produced by etching first of all trenches through the surface layer 106 and/or the oxide portions 130, and through the buried dielectric layer 104 and a part of the thickness of the base layer 102 up to the sought depth, then filling these trenches with a dielectric material, for example $SiO_2$.

Dielectric isolation portions 134 are also produced around the second regions 114. Given that producing these portions 134 includes producing trenches through the entire thickness of the surface layer 106 and the buried dielectric layer 104, this may create tensile strains in the second regions 114, which will be beneficial for the subsequent production of the NMOS transistors in the second regions 114.

Figure 11:
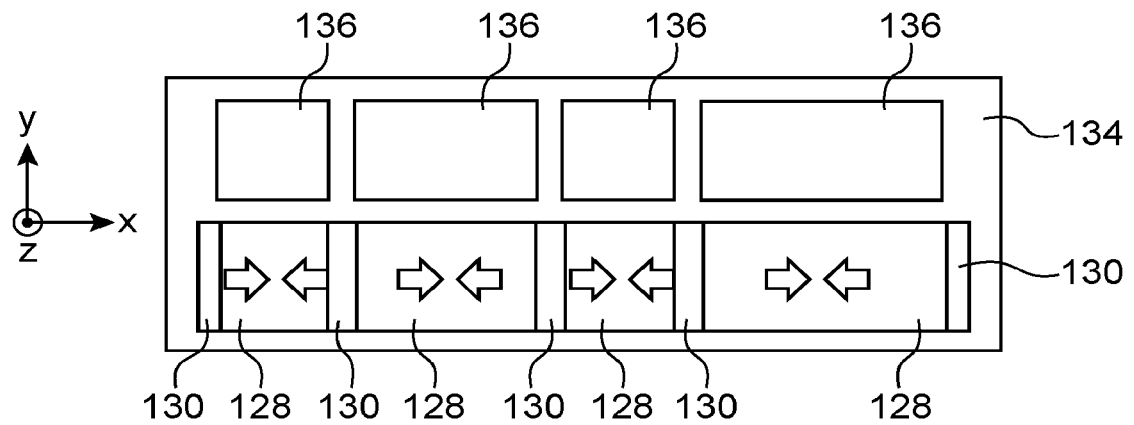

FIG. 11 shows a top view of the structure obtained following the steps described above, according to a first particular configuration. In this figure, the oxide portions 130 are produced at the edges of the portions 128 which are oriented, or which extend, perpendicularly to the longitudinal direction, or perpendicularly to the length of the channels (direction from the source to the drain) of the PMOS transistors which will be subsequently produced on and in the portions 128. The dielectric isolation portions 134 surround the assembly formed of the portions 128 and the oxide portions 130. In this figure, the dielectric isolation portions 134 are also produced to electrically isolate therebetween different parts 136 of the second region 114.

The arrows seen in FIG. 11 represent the strains in the semiconductor material of the portions 128. These arrows show that the compressive strain is indeed retained in the semiconductor of the portions 128 in the longitudinal direction, and that a strain tending toward more tensile strain is present in these portions 128 in the transversal direction, particularly due to the small dimensions (width of each of the portions 128 of less than 500 nm) of these portions 128 in the transversal direction. This progression of the strain toward more tensile strain (i.e. the relaxation of the initial compressive strain) is obtained in that, when producing the trenches intended to serve to produce dielectric isolation portions 134, these trenches etched against the edges of the portions 128 which are oriented parallel with the longitudinal direction induce a relaxation of the compressive strain along the transversal direction.

When the initial semiconductor of the layer 106 is tensile strained, for example when the initial substrate used is for example of the sSOI (strained silicon on insulator) type with a tensile strain present in the silicon, this tensile strain may be found in the semiconductor of the portions 136, in the longitudinal direction and in the transversal direction.

Figure 12:
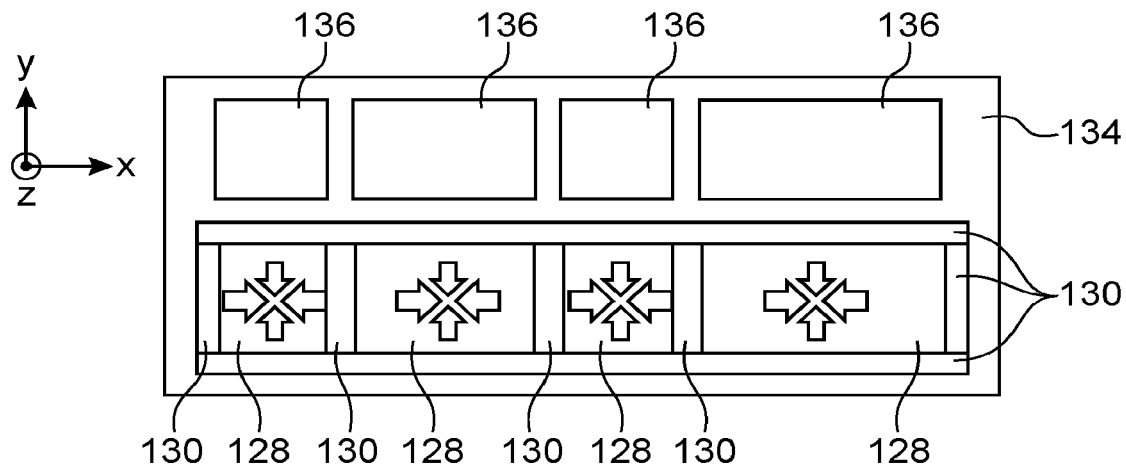

FIG. 12 shows a top view of the structure obtained following the steps described above, according to a second particular configuration. Unlike the first configuration described above, the oxide portions 130 are produced at all the edges of the portions 128, i.e. not only those which are oriented perpendicularly to the longitudinal direction, but also those oriented parallel with this longitudinal direction. Thus, the biaxial compressive strain initially present in the semiconductor of the portions 128 is retained even after producing the dielectric isolation portions 134 which does not impact this strain. As for FIG. 11, the arrows seen in FIG. 12 represent the strains present in the semiconductor of the portions 128. As above, when the initial semiconductor of the layer 106 is tensile strained, this tensile strain may be found in the semiconductor of the portions 136, in the longitudinal direction and in the transversal direction.

Figure 13:
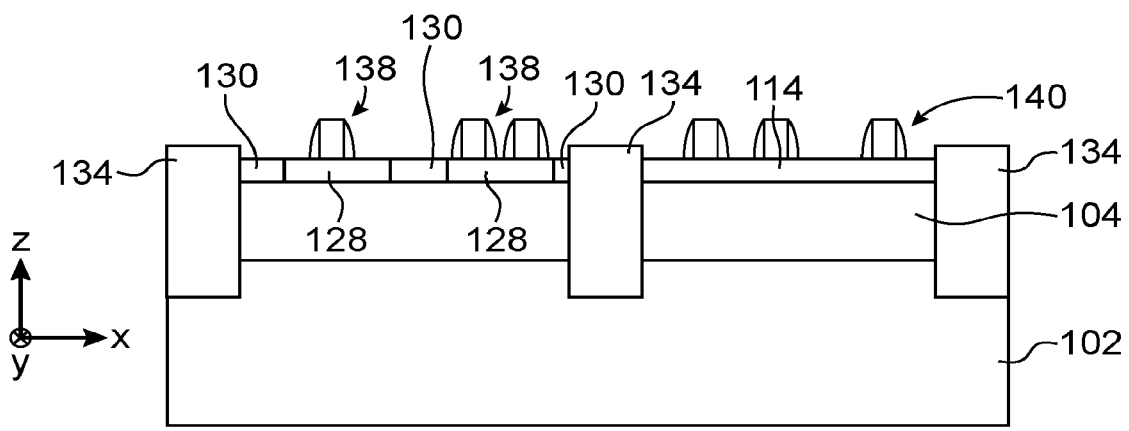

Finally, the method is completed by producing PMOS transistors 138 on and in the portions 128, and NMOS transistors 140 on and in the parts 136 of the second region 114 (see FIG. 13). The definitive gates of these transistors are particularly produced after the steps described above.

Other types of semiconductor devices may be produced in the portions 128 and 136 obtained, such as for example MOSFET-based memories, or indeed devices of the field of optics or photonics.

The invention claimed is:
1. A method for producing at least one semiconductor device, including the implementation of the following steps:
producing, on at least a first region of a surface layer, the surface layer comprising a first semiconductor and being disposed on a buried dielectric layer of a semiconductor-on-insulator type substrate, a layer of a second semiconductor which is compressive strained at least along a first direction;

etching at least one trench through the layer of the second semiconductor forming at least one edge of at least one portion of the layer of the second semiconductor, the at least one edge being oriented perpendicularly to the first direction, and such that a bottom wall of the at least one trench is formed by the surface layer;

using thermal oxidation, simultaneously forming:
in the surface layer, at least one semiconductor portion which is compressive strained at least along the first direction, and
in the at least one trench, at least one first oxide portion; and producing dielectric isolation portions around the at least one compressive strained semiconductor portion and the at least one first oxide portion at least one of through the surface layer and the buried dielectric layer and through the at least one first oxide portion and the buried dielectric layer, wherein the first semiconductor is silicon, the second semiconductor is SiGe, and said at least one compressive strained semiconductor portion includes SiGe.

2. The method according to claim 1, wherein
etching the at least one trench comprises etching several trenches through the layer of the second semiconductor to form all edges of several portions of the layer of the second semiconductor, the edges being oriented perpendicularly to the first direction,
the simultaneous forming forms in the surface layer several compressive strained semiconductor portions electrically isolated from one another by several first oxide portions, and
producing the dielectric isolation portions comprises producing the dielectric portions to surround an assembly formed of the compressive strained semiconductor portions and the first oxide portions.

3. The method according to claim 1, comprising:
protecting a second region of the surface layer using a mask during producing the layer of the second semiconductor, etching the at least one trench, and simultaneously forming;
producing the dielectric isolation portions to surround at least the second region of the surface layer; and
producing at least one of the dielectric isolation portions to electrically isolate the second region of the surface layer with respect to the compressive strained semiconductor portions.

4. The method according to claim 1, further comprising, between the simultaneous forming and producing the dielectric isolation portions:
depositing an oxide layer covering the at least one first oxide portion and at least one second oxide portion formed on the at least one compressive strained semiconductor portion from the at least one portion of the layer of the second semiconductor following the simultaneous forming, and wherein a thickness of the oxide layer is greater than a thickness of the at least one compressive strained semiconductor portion;
chemical mechanical planarizing the oxide layer; and
removing remaining parts of the oxide layer and the second oxide portion(s).

5. The method according to claim 4, comprising:
protecting a second region of the surface layer using a mask during producing the layer of the second semiconductor, etching the at least one trench, and simultaneously forming; and
producing the dielectric isolation portions to surround at least the second region of the surface layer, wherein
at least one of the dielectric isolation portions electrically isolates the second region of the surface layer with respect to the compressive strained semiconductor portion(s),
the oxide layer also covers the mask protecting the second region of the surface layer;
the chemical mechanical planarization of the oxide layer is stopped on the mask; and
removing remaining parts of the oxide layer and the at least one second oxide portion corresponds to a deoxidation which is controlled and stopped on the at least one compressive strained semiconductor portion.

6. The method according to claim 1, wherein the steps of the method are implemented such that:
the at least one trench completely surrounds, in a plane parallel with an interface between the buried dielectric layer and the surface layer, each portion of the layer of the second semiconductor; and
the at least one compressive strained semiconductor portion is surrounded completely, in the plane, by the first oxide portions.

7. The method according to claim 1, comprising epitaxially producing the layer of the second semiconductor which is compressive strained.

8. The method according to claim 1, comprising:
protecting a second region of the surface layer using a mask during producing the layer of the second semiconductor, etching the at least one trench, and simultaneously forming; and
after producing the dielectric isolation portions, producing at least one P-type FET transistor on and in the compressive strained semiconductor portion and producing at least one N-type FET transistor on and in the second region of the surface layer.

9. The method according to claim 1, wherein the steps of the method are not implemented simultaneously.

10. The method according to claim 1, further comprising a step of producing a gate of said at least one semiconductor device implemented after the etching, two producing, and simultaneous forming steps.

* * * * *